(12) United States Patent
Wei

(10) Patent No.: US 6,925,829 B2
(45) Date of Patent: Aug. 9, 2005

(54) COOLING SYSTEM AND ELECTRONIC APPARATUS HAVING THE SAME

(75) Inventor: Jie Wei, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/370,525

(22) Filed: Feb. 24, 2003

(65) Prior Publication Data

US 2004/0016257 A1 Jan. 29, 2004

(30) Foreign Application Priority Data

Jul. 25, 2002  (JP) .................................... 2002-216414

(51) Int. Cl.[7] .............................................. F25D 23/12
(52) U.S. Cl. ................ 62/259.2; 165/80.3; 165/104.33; 361/694
(58) Field of Search ........................ 62/259.2; 165/80.3, 165/104.33; 361/694, 695

(56) References Cited

U.S. PATENT DOCUMENTS

| | | | |
|---|---|---|---|
| 5,157,941 A | * | 10/1992 | Cur et al. ...................... 62/441 |
| 8,913,582 | * | 6/1999 | Coonan ................... 312/223.3 |
| 5,964,279 A | | 10/1999 | Mochizuki et al. |
| 6,166,907 A | * | 12/2000 | Chien .......................... 361/699 |
| 6,196,009 B1 | * | 3/2001 | Nishi et al. ................... 62/155 |
| 6,308,524 B1 | | 10/2001 | Mochizuki et al. |
| 6,430,042 B1 | * | 8/2002 | Ohashi et al. .............. 361/687 |
| 6,434,955 B1 | * | 8/2002 | Ng et al. ...................... 62/106 |
| 6,467,295 B2 | * | 10/2002 | Oh et al. ................... 62/259.2 |
| 6,483,705 B2 | * | 11/2002 | Snyder et al. .............. 361/709 |
| 6,507,490 B2 | * | 1/2003 | Sasaki et al. ............... 361/687 |
| 6,512,673 B1 | * | 1/2003 | Wiley ......................... 361/695 |
| 6,519,149 B1 | * | 2/2003 | Inoue ......................... 361/689 |
| 6,543,246 B2 | * | 4/2003 | Wayburn et al. ........... 62/259.2 |
| 6,601,643 B2 | * | 8/2003 | Cho et al. .............. 165/104.26 |

FOREIGN PATENT DOCUMENTS

| | | | |
|---|---|---|---|
| JP | 406119083 A | * | 4/1994 |
| JP | 8-63261 | | 3/1996 |
| JP | 8-188064 | | 7/1996 |
| JP | 10-224069 | | 8/1998 |

* cited by examiner

*Primary Examiner*—William E. Tapolcai
*Assistant Examiner*—Mohammad M. Ali
(74) *Attorney, Agent, or Firm*—Staas & Halsey LLP

(57) ABSTRACT

A cooling system, applied to an electronic apparatus having a plurality of exoergic circuit elements, which cools the exoergic circuit elements using air supplied from the outside, includes a fin heat sink provided on the exoergic circuit elements, and an evaporator, located above the exoergic circuit elements, which cools the air and guides the cooled air to the fin heat sink.

24 Claims, 9 Drawing Sheets

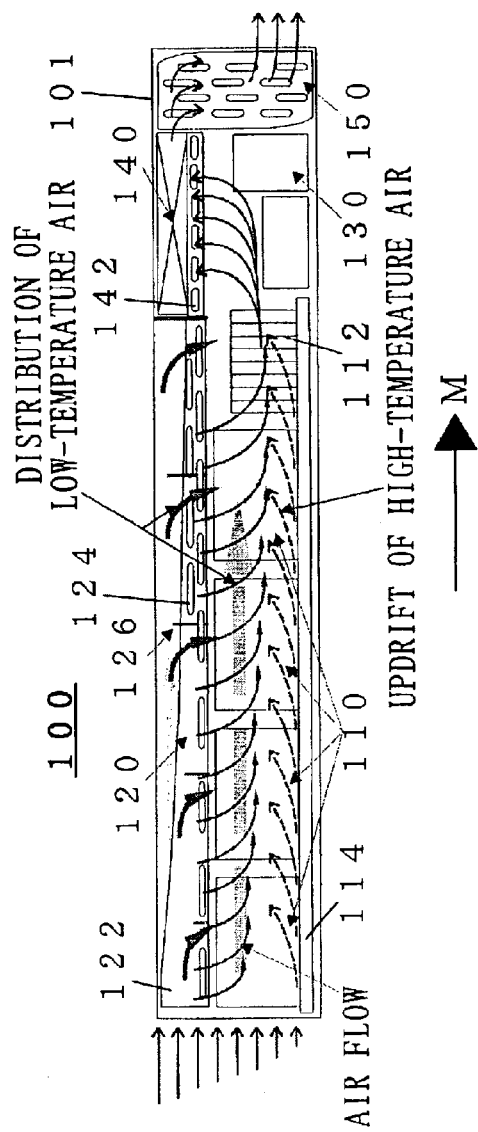
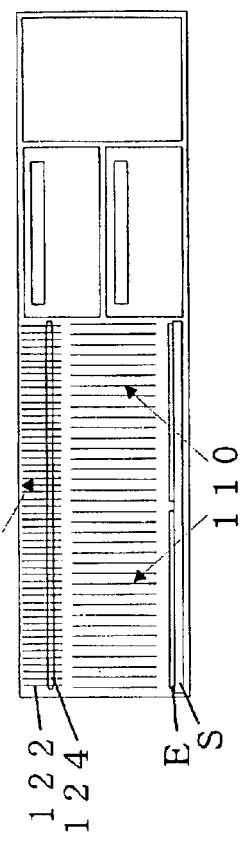
FIG. 1
FIG. 2

DISTRIBUTION OF LOW-TEMPERATURE AIR 2 0 0

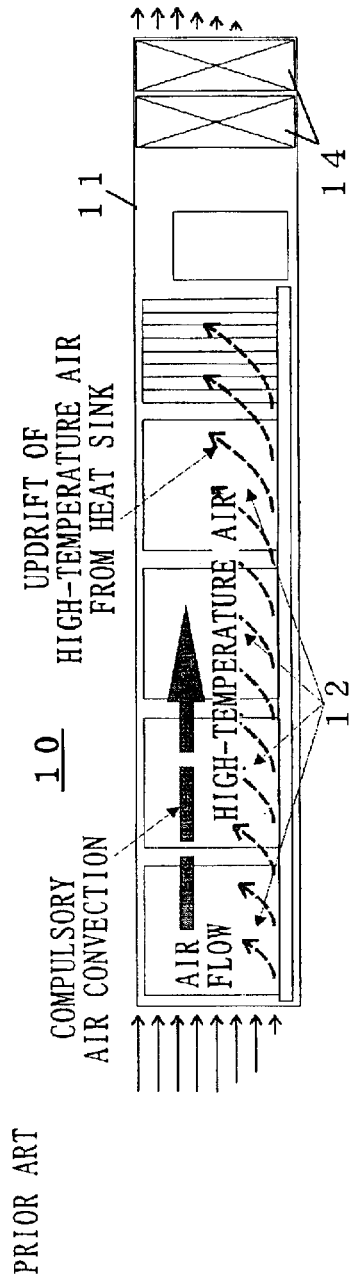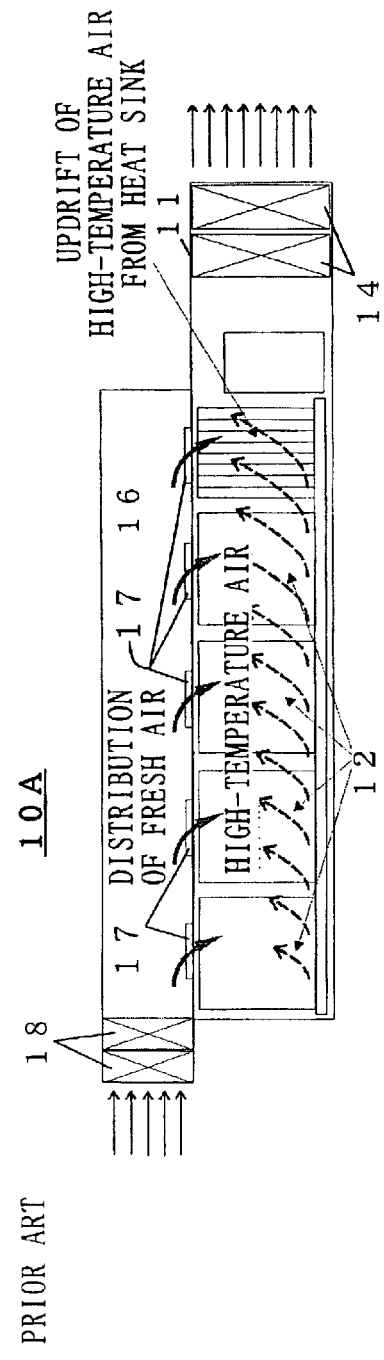

COOLING SYSTEM AND ELECTRONIC APPARATUS HAVING THE SAME

BACKGROUND OF THE INVENTION

The present invention relates generally to cooling systems, and more particularly to a cooling system for cooling an electronic apparatus having an exoergic circuit element (or exoergic element, electronic device, an LSI, or the like). The present invention is suitable, for example, for a cooling system for dissipating heat from various exoergic circuit elements mounted on system boards in a UNIX server or rack-mount server.

Recent developments of electronic apparatuses have required a high-density packing of a server (in particular, a board pitch) or, for example, a low profile server down to about 4 cm in height. On the other hand, the number of exoergic devices, such as a CPU, and the heat dissipation from these circuit elements tends to increase along with high performance and multi-functionality of various circuit elements mounted on a server system board. As the calorification without care would destabilize or deteriorate operations of the circuit elements, and cause thermal damages, various cooling technologies have been proposed for cooling exoergic circuit elements.

A description will now be given of conventional cooling systems with reference to FIGS. 9 to 13.

FIGS. 9 and 10 are schematic block diagrams showing conventional cooling systems 10 and 10A of an air cooling strategy. The cooling system 10 is equipped with a fin heat sink 12 on each of a plurality of exoergic electronic devices (not shown) in a housing 11, and dissipates the heat from the electronic devices (not shown) utilizing heat convection between compulsorily introduced air and a surface of the heat sink 12. The inside air is finally exhausted by the fan 14. On the other hand, the cooling system 10A provides an air duct 16 on the housing 11 in order to enhance the cooling efficiency to the downstream exoergic electronic devices, and provides every heat sink 12 with fresh air through air vents 17 provided in the air duct 16 and an air fan 18. That is, the cooling system 10 supplies downstream electronic devices with air warmed by the upstream heat sink 12, while the cooling system 10A uses the air duct 16 to supply the downstream electronic devices with fresh air. Air fans 14 finally exhaust air from the housing 11 of the cooling systems 10 and 10A.

FIGS. 11 and 12 are schematic block diagrams showing conventional cooling systems of a chilled air cooling strategy. The cooling system 20 arranges the air duct 16 with an evaporator 24. An air chiller (or referred to as a "cooling cycle") 22 is connected to the evaporator 24 and improves cooling efficiency by introducing chilled air into the electronic apparatus housing 11. That is, the cooling systems 20 and 20A are different in supplying chilled air to the housing 11 from the cooling systems 10 and 10A.

FIG. 13 is a schematic block diagram of a conventional cooling system 30 of a low-temperature liquid cooling type. A compressor 27 circulates coolant in a branch pipe 25, and evaporates the coolant in a cooling module 26 mounted on each heating element, for compulsory cooling. A condenser 28 is provided in the back of the fan 14.

However, the conventional cooling systems cannot satisfactorily meet demands for miniaturization and low profile of the electronic apparatus and cool the electronic apparatus sufficiently.

For example, the cooling systems 10 and 10A introduce the air of operational environment at temperature of 35° C. to 45° C. and has low cooling efficiency. The temperature of the air introduced to the heat sink 12 gradually increases downstream in the air flow direction, and makes it difficult to cool the downstream heating elements. Although the cooling system 10A has the air duct 16, air warmed by the upstream heat sink 12 is similarly supplied to the downstream electronic devices. On the other hand, the mounting interval of the heat sink 12 or the heat sink 12 itself when enlarged in order to improve the cooling performance in the housing 11, would not meet the demands for high-density packaging of the electronic devices and miniaturization and low profile of the housing 11.

The cooling system 20 causes a larger size of the apparatus due to the cooling cycle 22 and air duct 16, and thus is unsuitable for the high-density packaging. Similar to the cooling systems 10 and 10A, the cooling system 20 has low cooling efficiency to the downstream electronic devices. On the other hand, the evaporator 24 has a low heat exchange efficiency when chilling the air. The cooling system 20A is unsuitable for cooling a high power element.

The cooling system 30 provides each heating element with a coolant-use pipe for cooling it, and undesirably making the apparatus large and cooling system complicated. In particular, it is difficult to control a distribution of the coolant among branches in a biphasic state. As the structure of the coolant-use branch pipe 25 becomes complex and the number of connections in the cooling module 26 increases, the reliability and maintenance performance become lower and cost increases.

BRIEF SUMMARY OF THE INVENTION

Accordingly, it is an exemplified object of the present invention to provide a cooling system that may efficiently cool an electronic apparatus packaged in high density with a plurality of exoergic devices, the electronic apparatus having the same, and a server having the electronic apparatus.

Another exemplary object of the present invention is to provide a cooling system that reconciles the thin and small electronic apparatus with the enhanced cooling efficiency, and has good reliability, maintenance performance and economical efficiency, an electronic apparatus having the same, and a server having the electronic apparatus.

In order to achieve the above and other objects, a cooling system according to one aspect of the present invention, applied to an electronic apparatus having a plurality of exoergic circuit elements, which cools the exoergic circuit elements using air supplied from the outside includes a fin heat sink provided on the exoergic circuit elements, and an evaporator, located above the exoergic circuit elements, which cools the air and for guiding the cooled air to the fin heat sink. According to this cooling system, the evaporator has a cooling function and cools both the air supplied from the outside and the air warmed by the fin heat sink. The evaporator improves cooling performance and efficiency since it cools the air warmed by the fin heat sink. The evaporator also serves to guide the cooled air to the heat sink. The cooling system may be made small because the evaporator is made multifunctional, and located above the exoergic circuit elements so that it may enhance the heat exchange efficiency with the air and realize the miniaturization and low profile in comparison with a case where the evaporator is located near the entrance of the apparatus.

The evaporator may include evaporator fins having a shape for adjusting a dynamic pressure loss of an air flow from upstream to a downstream in a direction in which the air is introduced and exhausted. This cooling system improves the conventional low cooling efficiency at the downstream side, by changing a shape of the evaporator fin for adjusting an introduction of the cooled air to the downstream side, and by enhancing downstream cooling and uniformly cooling every electronic device using the coolant. The evaporator is arranged so that it may further cool the air at the downstream side, and improve deteriorated cooling efficiency at the downstream side.

The evaporator may further include a plurality of air plates that is located approximately perpendicular to the direction, and guide the air. According to this cooling system, the evaporator is so multifunctional that it serves to cool, guide and distribute the air. The term "approximately perpendicular" covers a case where the air plate is arranged not completely perpendicular to the air flow direction.

The cooling system may further include a blower that introduces the air in a housing in the electronic apparatus, and exhausts the air in a direction different from an air introduction direction, so as to make the cooling system small and thin. The blower serves to introduce the air and disperse the heat from the condenser, and thus is so multifunctional that it may contribute to miniaturization of the cooling system. The coolant-use pipe may be provided between the blower and the housing, thereby improving the heat dispersion performance for the condenser and system cooling efficiency.

It is preferable that the evaporator cools the air at a temperature equal to or higher than dew-point temperature (which is usually about 22° C.). This is because less than the dew point would require dehumidification of condensation.

An electronic apparatus having the above cooling system, and a rack server including one or more removable trays of the above electronic apparatuses constitute other aspects of the present invention. These electronic apparatus and server use the cooling system and prevent the internal circuits from getting thermally damaged while maintaining their small size and low profile.

A cooling system of another aspect of the present invention is applied to an electronic apparatus having a plurality of exoergic circuit elements, which cools the exoergic circuit elements using air supplied from the outside, wherein the plurality of exoergic circuit elements is arranged in an air flow direction, and wherein the cooling system comprising an evaporator, located above the exoergic circuit elements, cools the air and the exoergic circuit elements using the cooled air. The cooling system may further include a fin heat sink on the exoergic circuit elements, and the evaporator guides the cooled air to the fin heat sink. The evaporator may include an evaporator fin having a shape for adjusting a dynamic pressure loss of an air flow from upstream to a downstream in a flow direction of the air. The evaporator may further include a plurality of air plates that is located approximately perpendicular to an introduction direction of the air, and guide the air. These cooling systems may exhibit the same operations as those of the above cooling system.

Other objects and further features of the present invention will become readily apparent from the following description of the embodiments with reference to accompanying drawings.

BRIEF DESCRIPTION OF THE DRAWINGS

FIG. 1 is a schematic sectional view of a cooling system of one embodiment according to the present invention.

FIG. 2 is a schematic side view of an evaporator and a fin heat sink in the cooling system shown in FIG. 1.

FIG. 9 is a schematic block diagram of a conventional cooling system of an air cooling type.

FIG. 10 is a schematic block diagram of another conventional cooling system of an air cooling type.

DETAILED DESCRIPTION OF THE INVENTION

Figure 3:
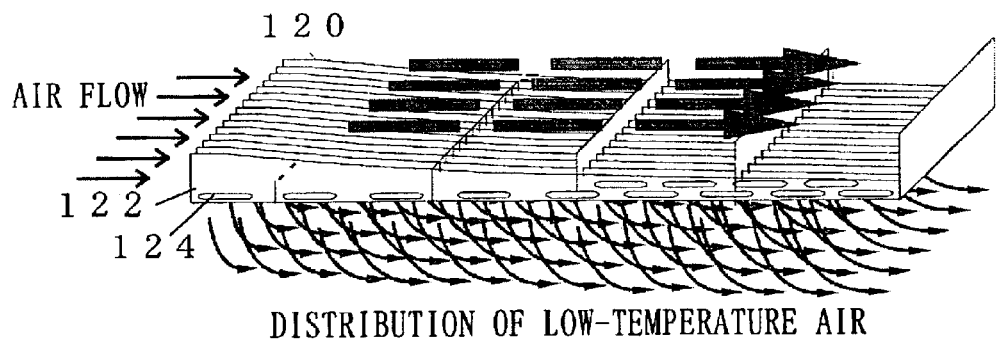
FIG. 3 is a schematic perspective view of the evaporator shown in FIG. 1.

Referring now to the accompanying drawings, a description will be given of a cooling system 105 of one embodiment according to the present invention and an electronic apparatus 100 having the cooling system 105. Here, FIG. 1 is a schematic sectional view of a cooling system 105. The cooling system 105 serves to cool exoergic elements by introducing the air from the outside and exhausting the same in a housing 101 of the electronic apparatus 100 including a plurality of exoergic elements, and includes a fin heat sink 110 and an air cooling part.

The fin heat sink 110 integrally forms cooling fins 112, and a base 114 that forms a bottom of the cooling fin 112 and enables the heat to transmit from the exoergic element to the cooling fin 112.

The heat sink 110 of the instant embodiment thermally contacts the exoergic elements (not shown in FIG. 1), such as a CPU, located under the base 114 so as to cool the exoergic elements.

The cooling fins 112 include multiple plate fins aligned in parallel, and enhance the heat dissipation effect by forming a convex shape and increasing the surface area. However, the shape of the cooling fin 112 is not limited to a plate shape, but may include arbitrary shapes such as a pin shape and a curve shape. These fins 112 do not have to be arranged in parallel at a regular interval in a lateral direction, and may be arranged radially or obliquely relative to the base 114. The number of fins 112 may be determined arbitrarily. It is preferable that the fin 112 is made of highly thermal conductive materials, such as aluminum, copper, aluminum nitride, and artificial diamond. The fin 112 is formed by molding, press fitting, waxing, welding, injection molding, etc.

The base 114 is made of highly thermal conductive materials, such as aluminum, copper, aluminum nitride, and artificial diamond. It is preferable that the bottom of the base 114 is formed to be flat to decrease the thermal resistance as a result of contact with the exoergic element. The heat sink 110 is manufactured by sheet metal working, aluminum die casting, and other methods.

If necessary, the base 114 may form a hollow part perpendicular to a paper surface in FIG. 1 and form a heat pipe plate accommodating cooling water (water and other coolant (such as freon, alcohol, ammonium, gulden, and flon). The reflux of the cooling water using a capillary phenomenon is effective by inserting a mesh or wick into the hollow part. If necessary, the base 114 may be connected to the outside heat pipe, etc. Here, the heat pipe is a tube made of aluminum, stainless, steel, etc., and has a difference of elevation. The pipe has an inner lining of wick material such as glass fiber and meshed thin copper wire, and accommodates cooling water such as water with decreased internal pressure. It cools the exoergic element by repeating the following cycle: The water evaporates when receiving the heat from the heating element at a low position and moves to a high position. Then, it is cooled naturally or compulsorily and liquefied again at the high position, and returns to the low position.

Figure 7A:
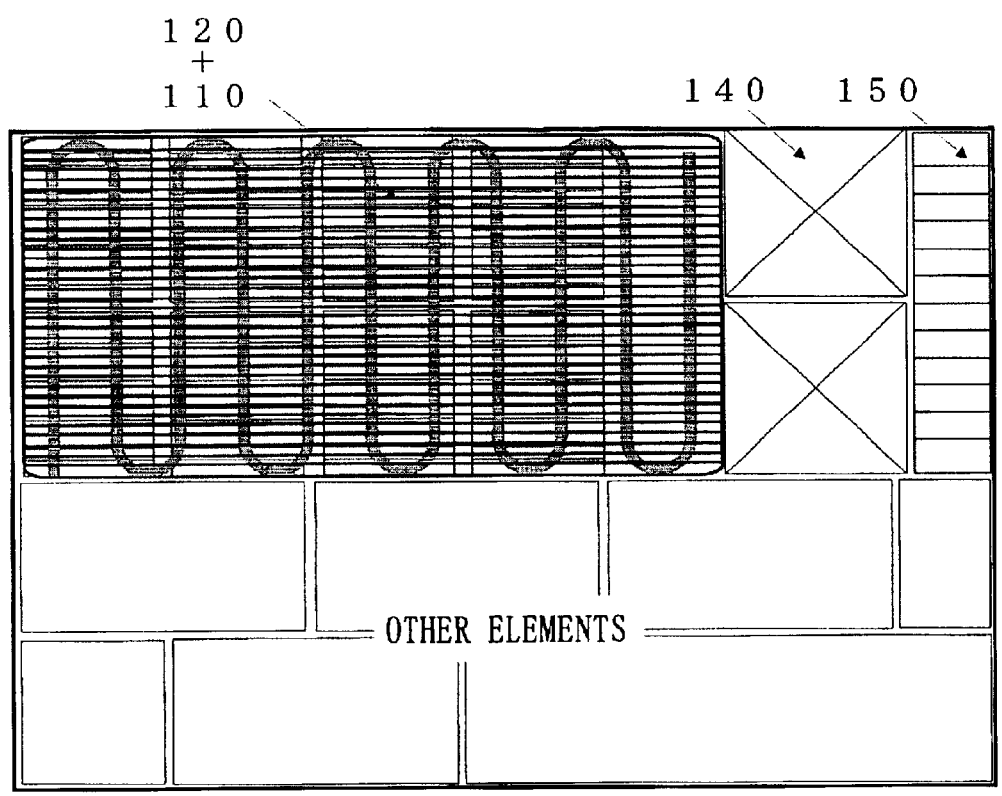
FIG. 7A shows eight heat sinks on eight exoergic elements in a 2×4 matrix, and an evaporator located above them.
Figure 7B:
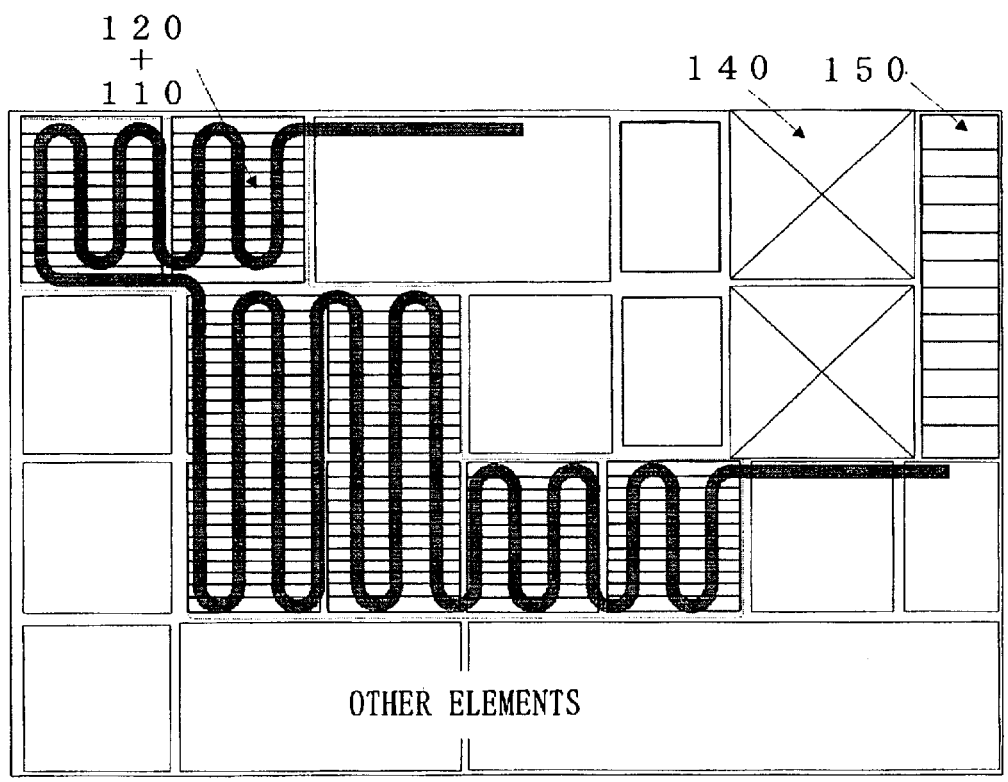
FIG. 7B shows eight heat sinks on eight exoergic elements in 1×2, 2×2, 1×2 matrixes and an evaporator located above them.

As shown in FIGS. 7A and 7B, the heat sink 110 may be arranged at arbitrary positions depending upon the arrangement of the exoergic elements. Here, FIG. 7A shows eight heat sinks 110 on eight exoergic elements in a 2×4 matrix, and an evaporator 120 located above them. FIG. 7B shows eight heat sinks 110 on eight exoergic elements in 1×1, 2×2, 1×2 matrixes, and an evaporator 120 located above them.

The air cooling part introduces, cools, distributes, and exhausts the air, and includes an evaporator 120, a compressor 130, a blower 140, and a condenser 150.

The evaporator 120 is a fin tube or fin plate air cooler for cooling and for guiding the air. The evaporator 120 cools the exoergic elements by cooling the heat transmitted to the air from the fin heat sink 110. The air chilled by the evaporator 120 directly contacts the fin heat sink 110, thereby cooling the exoergic elements. The evaporator 120 includes a plurality of evaporator fins 122, a coolant-use pipe 124, and a plurality of air plates 126. The evaporator 120 may have an arbitrary position depending upon the arrangement of the exoergic elements, as shown in FIGS. 7A and 7B.

The evaporator fin 122 is a fin for cooling the air at its surface and for forming an air channel. As shown in FIG. 2, the evaporator fin 122 includes a plurality of thin plates. Here, FIG. 2 is a schematic sectional view of the evaporator 120 and fin heat sink 110 shown in FIG. 1. E is an exoergic element, and S is a substrate.

A plurality of evaporator fins 122 is arranged at a regular interval, and its area decreases to the downstream in a direction M in which the air is introduced into the housing 101 and exhausted from the housing 101. In FIGS. 1 and 3, the evaporator fin 122 has a slope shape combining a rectangle and a triangle with each other. Here, FIG. 3 is a schematic perspective view of the evaporator 120 shown in FIG. 1. A simulation may determine the way of changing a shape of the evaporator fin 122 and the outline of the evaporator fin 122 so as to enhance the cooling performance at the downstream side in the direction M. A simulation may determine the cooling performance at the downstream side so that all of the exoergic elements may be finally cooled with similar cooling efficiency since it may be assumed that all the exoergic elements have the same heat dissipation, for example, when the exoergic element is a CPU.

Figure 4:
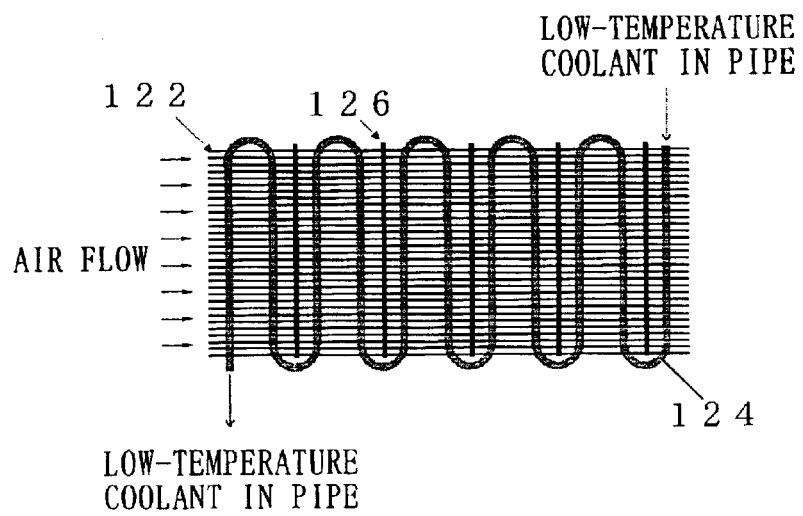
FIG. 4 is a plane view of the evaporator shown in FIG. 1

The coolant-use pipe 124 provides the evaporator 120 with the cooling function. The coolant-use pipe 124 is arranged denser downstream so as to maintain the same cooling performance since the evaporator fin 122 decreases its area at the downstream side. Although the instant embodiment uses a regular interval and multiple stages, the interval may be narrower to the downstream in the direction M. As shown in FIG. 4, the pipe extends like a waveform. Here, FIG. 4 is a plane view of the coolant-use pipe 124. The sectional shape of the pipe 124 may be a circle or another shape, or the pipe 124 may have a different sectional shape at a different position, for example, a thicker sectional shape at the downstream side in the direction M. In addition, FIG. 4 shows a regular folded interval of the pipe 124, but the interval may be irregular, for example, a thicker interval at the downstream side in the direction M. A simulation may freely determine a sectional shape, size, folded interval of the pipe 124 based on necessary cooling efficiency.

The coolant may use freon, ammonia, flon, etc. It is preferable that the temperature of the air cooled by the coolant is equal to or higher than the dew point, because less than the dew point would require dehumidification of condensation. The coolant-use pipe 124 has good economical efficiency, reliability, and maintenance performance because it is not branched like the conventional cooling system 30.

The instant embodiment arranges four air plates 126 perpendicular to the direction M, which are thin plates for guiding the air to the fin heat sink 112. A simulation may freely determine the interval between the air plates 126 and the number of air plates 126 based on necessary cooling performance.

The compressor 130 controls a coolant circulation in the pipe 124. The coolant is compressed by the compressor 130, and radiates to the outside the heat used to cool the gaseous phase coolant of high temperature and high pressure at the condenser 150. Then, an expansion mechanism (not shown) decreases its pressure and turns the coolant to be low temperature and low pressure. The coolant absorbs the heat at the evaporator, vaporizes and returns to the compressor 130.

Figure 6A:
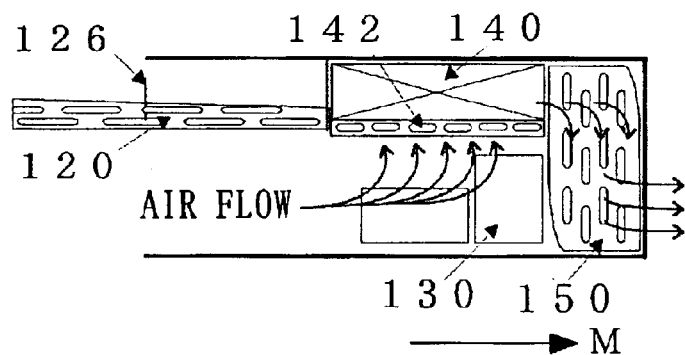
FIG. 6A is a schematic enlarged sectional view near the blower shown in FIG. 1.
Figure 6B:
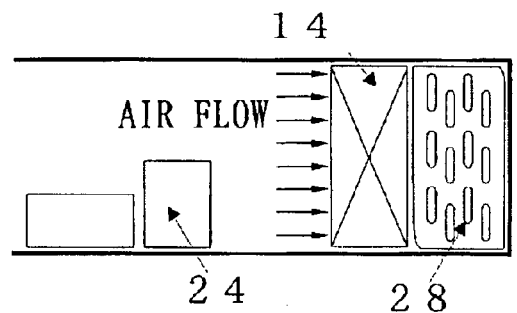
FIG. 6B is a schematic enlarged sectional view near a fan in the conventional cooling system.

The blower 140 is located around the exit downstream in the direction M. The blower 140 exhausts the air in a direction different from the air introduction direction, unlike an axial fan. In this embodiment, as shown in FIGS. 1 and 6A, the blower 140 absorbs the air from down to up, and exhausts the air to the right, i.e., in a direction perpendicular to the air intake direction. On the other hand, the air introduction direction accords with the exhaustion direction in the axial fan in FIG. 6B. Here, FIG. 6A is a schematic enlarged sectional view near the blower 140 shown in FIG. 1, and FIG. 6B is a schematic enlarged sectional view near the fan 14 in the cooling system 30.

A fan needs to maintain a certain diameter to secure exhaust performance to some extent. The axial fan restricts the low profile of the electronic apparatus since the radial direction accords with the height direction of the electronic apparatus as shown in FIG. 6B. On the other hand, in the blower 140, the radial direction is the direction M as shown in FIG. 6A, not the height direction of the electronic apparatus, and thus does not prevent the low profile of the electronic apparatus. A controller (not shown) may control the rotary speed of the blower 140.

As shown in FIG. 1, the blower 140 serves to introduce the air from the entrance of the apparatus to the inside, and cool the condenser 150. As it is not necessary to provide two fans 14 and 18 as in the cooling system 10A, the blower 140 contributes to miniaturization and enhances the economic efficiency. A superheater 142 is provided under the blower 140. The superheater 142 has a duct similar to the coolant-use pipe 124, and cools the exhaust air to the condenser 150, thereby enhancing the heat dispersion performance of the condenser 150 and system cooling efficiency.

The condenser 150 exchanges heat between the coolant and the exhaust air from the blower 140. The condenser 150 liquefies the gaseous phase coolant of high temperature and high pressure from the compressor 130.

Figure 5:
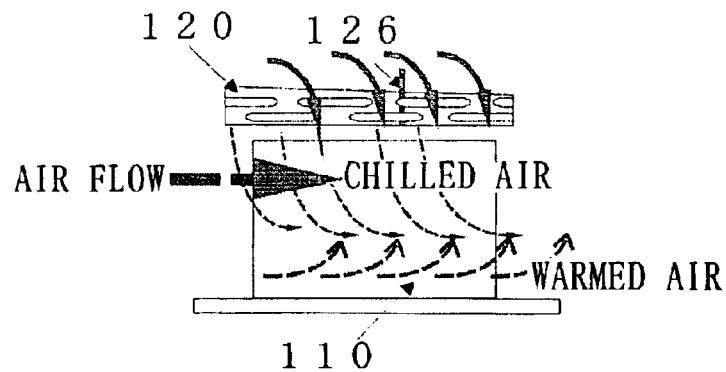
FIG. 5 is a view for explaining an air flow with the evaporator and fin heat sink shown in FIG. 1.

Thus, the instant embodiment arranges the evaporator that has been provided at the entrance of the housing of the conventional electronic device, above the heat sink 110, and makes the evaporator 120 multifunctional so that the evaporator 120 has a cooling function. Therefore, as shown in FIG. 5, this cooling system may cool both the fresh air introduced from the apparatus entrance and the elevating air warmed by the heat sink 110. Here, FIG. 5 is a view for explaining an air flow by the evaporator 120. A combination between the evaporator 120 and each heat sink 110 would provide each heat sink 110 with high heat exchange performance and cooling efficiency.

According to the instant embodiment, the temperature of the air introduced to the heat sink 110 is, for example, about 25° C. cooled by the pipe 124, not the environmental temperature, for example, of 45° C. about 35° C. to 45° C. In addition, the instant embodiment has an effect of cooling the elevating air warmed by the heat sink 110, as unseen in the evaporators in the conventional cooling systems 20 and 20A. Moreover, the evaporator 120 has a cooling function, is located on the exoergic elements, and contributes to a low profile of the apparatus. As shown in the cooling systems 20 and 20A, if the evaporator 120 is provided at the entrance of the housing, it should be made large enough to cool the most downstream exoergic elements in the direction M, while the instant embodiment shortens the distance between the exoergic element and the evaporator 120 and enables the evaporator 120 to be made smaller.

In addition, the instant embodiment enhances the cooling efficiency downstream in the direction M, and prevents the downstream exoergic elements from being insufficiently cooled.

The air plate 126 guides the cooled air and controls distribution of the air so that each heat sink 110 is uniformly cooled finally. Since the air plate 126 guides the cooled air so that the air may not be supplied only to some of the exoergic elements, the instant embodiment may enhance the cooling performance to each exoergic element, in particular, those at the downstream side more than twice as much as the conventional cooling system.

Since the instant embodiment improves the cooling efficiency in comparison with the conventional cooling system, the electronic apparatus may be equipped with more electronic devices in the housing, improving the apparatus performance and realizing high-density packaging. In addition, smaller and lighter heat sinks than those of the conventional cooling system may achieve the equivalent or higher cooling efficiency.

A description will now be given of an operation of the cooling system 105. When the exoergic element such as a CPU operates, the controller (not shown) supplies a drive instruction to a rotation control part (not shown) for controlling the blower 140, and the rotation control part rotates the blower 140 at instructed rotary speed. Thereby, the air is supplied to the inside of the housing and exhausted from the condenser 150. The controller (not shown) controls the compressor 130 and controls coolant circulation in the pipe 124. As a result, the air introduced from the outside and warmed by the heat sink 110 is cooled by the pipe 124. The heat from the exoergic element is dissipated by the heat sink 110 connected thermally to the exoergic element and the chilled air also cools the exoergic element. The cooled air also cools the heat sink 110, enhancing the cooling performance of the heat sink 110.

If necessary, a temperature detector may be provided at or near each exoergic element, and the controller may control the number of rotations of the blower 140 and output action of the compressor 130 based on the detection result by the temperature detector. Such a temperature detector may utilize a thermal diode, a thermocouple, a thermistor, etc. The temperature detector may be provided near the pipe 124. Since the temperature of the pipe 124 is the lowest in the housing, the controller may prevent an occurrence of the condensation by controlling operations of the blower 140 and compressor 130 so that the temperature near the pipe 124 exceeds the dew point.

The evaporator 120 guides the cooled air to and distributes the cooled air among the exoergic elements using the air plates 126. This cooling system 105 supplies sufficiently cooled air to the exoergic elements downstream in the direction M, preventing them from getting thermal damaged.

Figure 8A:
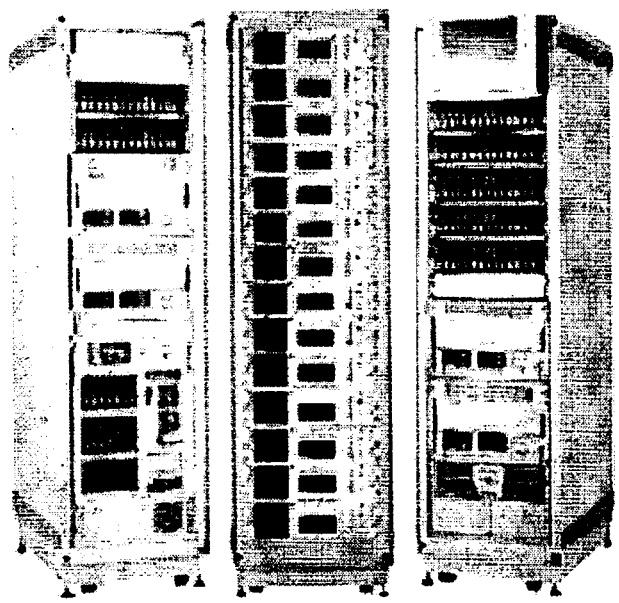
FIG. 8 is a perspective view of a rack server and tray servers withdrawn from the rack to which the present invention is applicable.
Figure 8B:
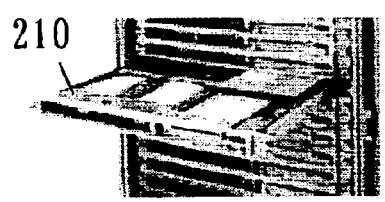
Figure 11:
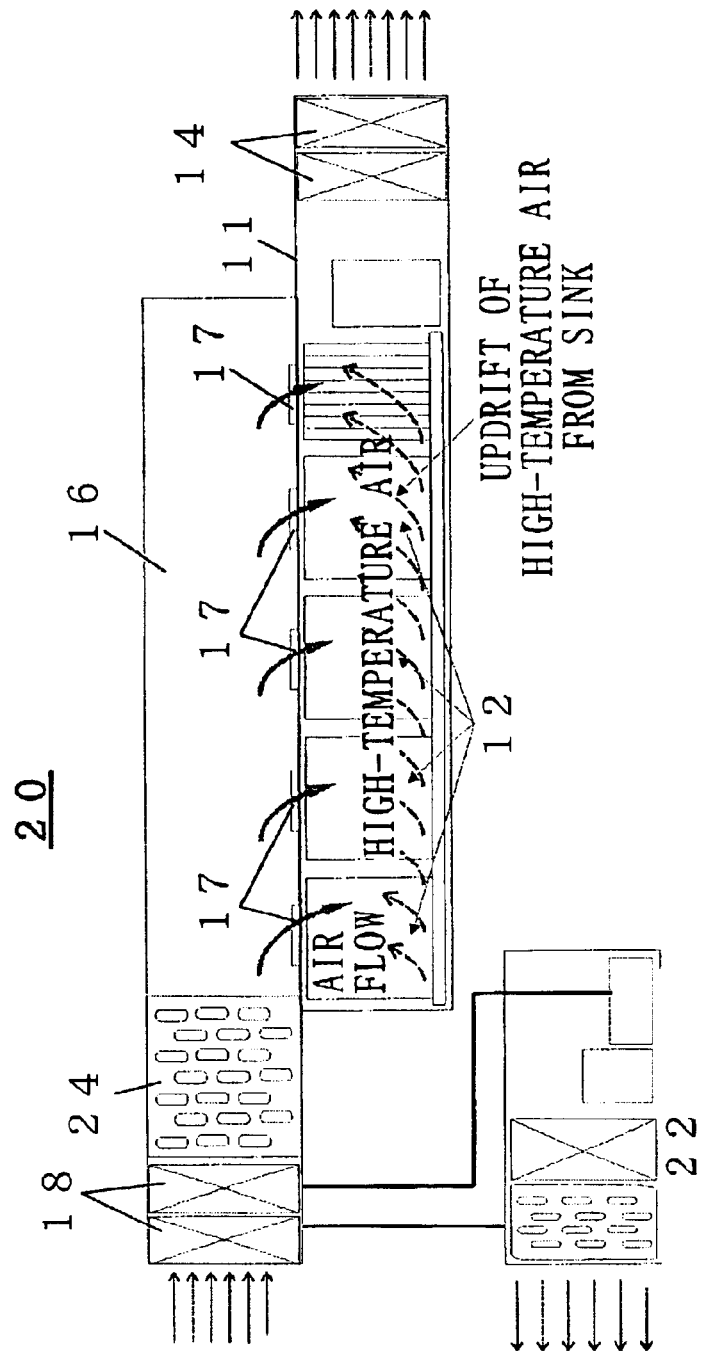
FIG. 11 is a schematic block diagram of a conventional cooling system of a chilled air cooling type.
Figure 12:
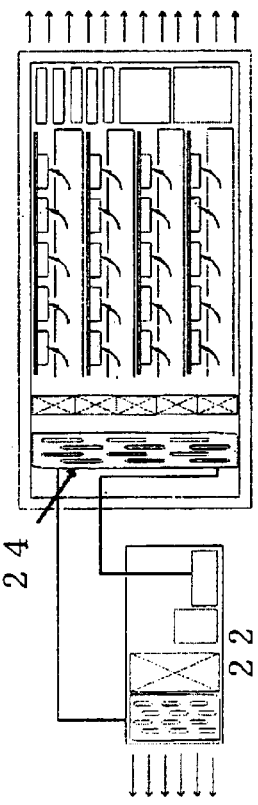
FIG. 12 is a schematic block diagram of another conventional cooling system of a chilled air cooling type.
Figure 13:
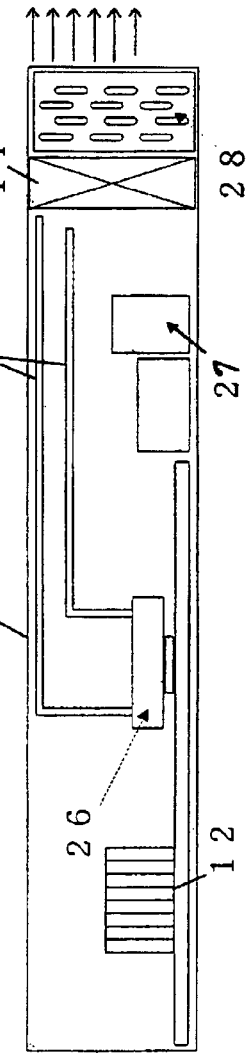
FIG. 13 is a schematic block diagram of a conventional cooling system of a low-temperature liquid cooling type.

Referring now to FIG. 8, a description will be given of a thin rack server 200 to which the electronic apparatus of the instant embodiment is applied. FIG. 8A is an overview of the rack mount server 200. The server 200 has a rack shape, and includes multiple stages of removable trays 210 as shown in FIG. 8B. Each tray 210 serves as a server, and is equipped with the electronic apparatus having the cooling system 105 shown in FIGS. 1 to 7.

According to the instant embodiment, the cooling system 105 may make each tray 210 thinner and thus the entire height of the server 200 lower, realizing the miniaturization and low profile.

Further, the present invention is not limited to these preferred embodiments, and various modifications and variations may be made without departing from the scope of the present invention. For example, although the instant embodiment discusses the server, the electronic apparatus to which the present invention is applicable is not limited to a server, but may cover a large-size computer, a multi-chip module of an electronic exchange machine, and a parallel processor.

Thus, the present invention may provide a cooling system that efficiently cools an electronic apparatus with a plurality of exoergic circuit elements arranged with high density and provides the electronic apparatus with sufficient small size, reliability, maintenance performance and economical efficiency, an electronic apparatus having the same, and a server having the electronic apparatus.

What is claimed is:

1. A cooling system, applied to an electronic apparatus having a plurality of exoergic circuit elements arranged along a path, which cools the exoergic circuit elements using a continuous stream of air supplied from the outside, said cooling system comprising:

a fin heat sink provided over the plurality of exoergic circuit elements; and an evaporator, located adjacent to and extending above the fin heat sink along the path, which cools both the air supplied from outside and the air warmed by the fin heat sink, and also serves to guide the cooled air to said fin heat sink, and wherein said evaporator includes an evaporator fin having a shape for adjusting a dynamic pressure loss of an air flow from an upstream to a downstream in a first direction in which the air is introduced and exhausted.

2. A cooling system according to claim 1, wherein said evaporator includes a coolant-use pipe that is arranged so as to cool the air in a downstream side in the first direction, and perforates through the evaporator fin.

3. A cooling system according to claim 1, wherein said evaporator further includes a plurality of air plates that are arranged approximately perpendicular to the first direction, and guide the air.

4. A cooling system according to claim 1, further comprising a blower that introduces the air into a housing in the electronic apparatus, and exhausts the air in a direction different from the first direction.

5. A cooling system according to claim 4, further comprising a condenser which exchanges heat of the air exhausted by said blower, wherein said blower disperses heat from said condenser.

6. A cooling system according to claim 4, further comprising a coolant-use pipe between said blower and the housing.

7. A cooling system according to claim 1, wherein said evaporator cools the air at a temperature equal to or higher than dew-point temperature.

8. An electronic apparatus comprising a plurality of exoergic circuit elements arranged along a path, and a cooling system which cools the exoergic circuit elements that includes:
 a fin heat sink provided over the plurality of exoergic circuit elements; and
 an evaporator, located adjacent to and extending above the fin heat sink, along the path, which cools both the air supplied from the outside and the air warmed by the fin heat sink, and also serves to guide a continuous stream of the cooled air to the fin heat sink, and
 wherein said evaporator includes an evaporator fin having a shape for adjusting a dynamic pressure loss of an air flow from an upstream to a downstream in a direction in which the air is introduced and exhausted.

9. A rack server comprising one or more drawers of tray electronic apparatuses, wherein each tray electronic apparatus comprises a plurality of exoergic circuit elements arranged along a path; and a cooling system which cools the exoergic circuit elements that includes a fin heat sink provided over the plurality of exoergic circuit elements; and an evaporator, located adjacent to and extending above the fin heat sink along the path, which cools both the air supplied from the outside and the air warmed by the fin heat sink, and also serves to guide a continuous stream of the cooled air to the fin heat sink, and
 wherein said evaporator includes an evaporator fin having a shape for adjusting a dynamic pressure loss of an air flow from an upstream to a downstream in a direction in which the air is introduced and exhausted.

10. A cooling system, applied to an electronic apparatus having a plurality of exoergic circuit elements, which cools the exoergic circuit elements using a continuous stream of air supplied from the outside,
 wherein the plurality of exoergic circuit elements are arranged along a path in an air flow direction,
 wherein said cooling system comprises a continuous evaporator, extending above the exoergic circuit elements, which cools both the air supplied from outside and the air warmed by the exoergic elements, and also serves to guide the cooled air to exoergic circuit elements, and
 wherein said evaporator includes an evaporator fin having a shape for adjusting a dynamic pressure loss of an air flow from an upstream to a downstream in the air flow direction.

11. A cooling system according to claim 10, further comprising a fin heat sink over the exoergic circuit elements, and said evaporator guiding the cooled air to said fin heat sink.

12. A cooling system according to claim 11, wherein said evaporator further includes a plurality of air plates that are located approximately perpendicular to an introduction direction of the air, and guide the air.

13. A cooling system according to claim 11, wherein said evaporator further includes a plurality of air plates that is located approximately perpendicular to an introduction direction of the air, to guide the air to said fin heat sink.

14. A cooling system, applied to an electronic apparatus having a plurality of exoergic circuit elements arranged along a path, said cooling system having a first end at which air is supplied from the outside, and moves as a continuous stream in a first direction to a second end from which air is exhausted, and cooling the exoergic circuit elements using the air supplied from the outside, said cooling system comprising:
 a fin heat sink provided over the exoergic circuit elements; and
 an evaporator, located adjacent and extending above the fin heat sink along a distance between the first end and the second end, which cools both the air supplied from outside and the air warmed by the fin heat sink, and also serves to guide the cooled air substantially along the distance to said fin heat sink, said evaporator including a continuous coolant pipe extending along the evaporator, and
 wherein said evaporator includes an evaporator fin which decreases in height along the first direction.

15. A cooling system according to claim 14, wherein said coolant pipe perforates through the evaporator fin.

16. A cooling system according to claim 14, wherein said evaporator further includes a plurality of air plates that is arranged approximately perpendicular to the direction, to guide the air to said fin heat sink.

17. A cooling system according to claim 14, further comprising a blower at the second end that introduces the air at the first end, and exhausts the air in direction different from the first direction.

18. A cooling system according to claim 17, further comprising a condenser which exchanges heat of the air exhausted by said blower, wherein said blower disperses heat from said condenser.

19. A cooling system according to claim 14, wherein said coolant pipe extends between the first and second ends.

20. A cooling system according to claim 14, wherein said evaporator cools the air at a temperature equal to or higher than dew-point temperature.

21. An electronic apparatus comprising:
 a plurality of exoergic circuit elements arranged along an elongated path, and a cooling system having a first end at which air is supplied from the outside and moves in a first direction to a second end from which the air is exhausted, and cooling the exoergic circuit elements;
 a fin heat sink provided over the exoergic circuit elements; and
 a continuous evaporator, extending above the fin heat sink along a distance between the first end and the second end, which cools both the air supplied from outside and the air warmed by the fin heat sink, and also serves to guide a continuous stream of the cooled air substantially along the distance to the fin heat sink, said evaporator including a continuous coolant pipe extending along the evaporator, and wherein said evaporator includes an evaporator fin which decreases in height along the first direction.

22. A rack server comprising one or more drawers of tray electronic apparatuses, wherein each tray electronic apparatus comprises a plurality of exoergic circuit elements arranged along an elongated path, and a cooling system which has a first end at which air is supplied from the outside and moves in a first direction to a second end from which air is exhausted, and cooling the exoergic circuit elements, and that includes a fin heat sink provided over the exoergic circuit elements, and a continuous evaporator extends over the fin heat sink, which both the air supplied from the outside and the air warmed by the fin heat sink, and also serves to guide a continuous stream of the cooled air to the fin heat sink, said evaporator including a continuous coolant pipe extending along the evaporator, and wherein said evaporator includes an evaporator fin which decreases in height along the first direction.

23. A cooling system, applied to an electronic apparatus having a plurality of exoergic circuit elements arranged along and elongated path, which cools the exoergic circuit elements using air supplied from the outside, wherein the plurality of exoergic circuit elements is arranged in an air flow direction, and wherein said cooling system includes a continuous evaporator, extending above each of the exoergic circuit elements along the air flow direction, which cools both the air supplied from outside and the air warmed by the exoergic elements, and also serves to guide the cooled air to the exoergic circuit elements using a continuous stream of the cooled air, said evaporator including a continuous coolant pipe extending along the evaporator, and wherein said evaporator includes an evaporator fin which decreases in height along the air flow direction.

24. A cooling system according to claim 23, further comprising a fin heat sink over the exoergic circuit elements, and said evaporator guiding the cooled air to said fin heat sink.

* * * * *

UNITED STATES PATENT AND TRADEMARK OFFICE
CERTIFICATE OF CORRECTION

PATENT NO. : 6,925,829 B2
DATED : August 9, 2005
INVENTOR(S) : Wei

It is certified that error appears in the above-identified patent and that said Letters Patent is hereby corrected as shown below:

Column 9,
Line 66, after "air to" insert -- the --.

Column 10,
Line 46, after "in" insert -- a second --.

Signed and Sealed this

Eleventh Day of April, 2006

JON W. DUDAS
*Director of the United States Patent and Trademark Office*